United States Patent [19]

Roy

[11] Patent Number: 5,008,569
[45] Date of Patent: Apr. 16, 1991

[54] HIGH-SPEED DYNAMIC CMOS CIRCUIT AND PRECHARGE GENERATOR

[75] Inventor: Marc P. Roy, Nepean, Canada

[73] Assignee: Northern Telecom Limited, Montreal, Canada

[21] Appl. No.: 406,294

[22] Filed: Sep. 11, 1989

[51] Int. Cl.$^5$ .......................................... H03K 19/177
[52] U.S. Cl. .................................. 307/465; 307/469; 307/481; 307/243
[58] Field of Search .............. 307/443, 452, 465, 468, 307/469, 480, 481, 243, 269

[56] References Cited

U.S. PATENT DOCUMENTS

| | | | |
|---|---|---|---|
| 4,611,133 | 9/1986 | Peterson et al. | 307/465 |
| 4,697,105 | 9/1987 | Moy | 307/469 X |
| 4,740,721 | 4/1988 | Chung et al. | 307/481 X |
| 4,760,290 | 7/1988 | Martinez | 307/443 X |
| 4,764,691 | 8/1988 | Jochem | 307/468 |
| 4,769,562 | 9/1988 | Ghisio | 307/465 X |
| 4,868,413 | 9/1989 | Oakland et al. | 307/243 |
| 4,924,118 | 5/1990 | Kashimura | 307/469 X |
| 4,950,928 | 8/1990 | Schmizlein | 307/481 X |
| 4,959,646 | 9/1990 | Podkowa et al., | 307/465 X |

Primary Examiner—David Hudspeth
Attorney, Agent, or Firm—Philip W. Jones

[57] ABSTRACT

Programmable logic array, multiplexer and memory array circuits utilizing the dynamic CMOS logic of the invention are capable of operating at speeds approximating twice that of similar circuits utilizing conventional dynamic CMOs logic. The circuit of the invention has an AND plane defined by a series of input columns and a series of rows, and has an OR plane defined by the series of rows and one or more output columns. Transistors are connected selectively between the input columns and the rows, and between the output columns and the rows. During one state of an external clock input to the circuit, each of a series of inputs are placed on a respective one of the input columns, each of the output columns are precharged, and each of the rows is discharged. The shifting of the external clock input to the alternate state results in latching of the values on the input columns and in termination of the output column precharging and row discharging. Charge is then injected into each of the rows, and propagates through both the AND and OR planes while the external clock input is still in the alternate state. Unlike conventional two-plane dynamic CMOS logic circuits, there is no need for clocking circuitry intermediate of the two planes.

8 Claims, 7 Drawing Sheets

HIGH-SPEED DYNAMIC CMOS CIRCUIT AND PRECHARGE GENERATOR invention is a high-speed dynamic CMOS circuit, and more particularly, a dynamic CMOS circuit capable or low-power operation at very high speeds in logic array, memory array and multiplexer applications.

The increasing demand for high-speed performance in the major building blocks of VLSI circuits, including memory arrays, programmable logic arrays and multiplexers, has brought about rapid development in circuit techniques. Dynamic CMOS logic has successfully in the implementation of these circuits to provide maximum speed capability with low area cost. In programmable logic arrays (PLAs) dynamic CMOS logic is used in both the AND and OR planes to enhance performance. It is also used for the decoder sections of multiplexers and memory arrays.

Dynamic CMOS logic consists of a n-transistor logic structure having an output node which is pre-charged to VDD by a p-transistor (precharge phase) and conditionally discharged by a n-transistor (evaluate phase). It may alternatively consist of a p-transistor logic structure having an output node which is pre-charged to VSS by a n-transistor and conditionally discharged by a p-transistor. In the case of two-plane dynamic CMOS logic PLAs, multiplexers and memory arrays, the output of a n-transistor logic structure input plane is directly connected to a n-transistor logic structure output plane through intermediate logic using a multi-phase clock strategy. The intermediate logic consumes area and slows down the operation of the overall circuit.

The circuit of the invention dispenses with the intermediate logic and the multi-phase clock strategy, and has a correspondingly reduced area and improved speed. The basic gate of the invention consists of a n-transistor logic structure whose output node is discharged to VSS prior to evaluation and is conditionally charged by a p-transistor during evaluation. Programmable logic array, multiplexer and memory array circuits may be configured using the basic gate of the invention.

In a first form, the invention is a two-plane logic array circuit adapted to be operated from a single clock pulse train and having an input plane and an output plane. The input plane is defined by an array of rows and input columns, and the output plane is defined by an array of the rows and at least one output column. A series of first transistors is selectively positioned in the input plane at the intersection of the rows with the input columns such that a charge on one of the input columns results in the discharge of any charge on those rows sharing first transistors with that column. The circuit further comprises first, second, third, fourth and fifth gate means. The first gate means controls transmission of each of a first set of input signals to a respective one of the input columns. The second gate means controls the discharge of charge stored on the rows. The third gate means and the state of the input columns controls the charging of each of the rows with a respective one of a second set of input signals. The state of the rows controls the discharge of charge from the at least one output column. The fourth gate means controls a precharging of the at least one output column, (and the fifth gate means controls the transmission of the state of the at least one output column to the output of the logic array circuit. The first, second and fourth gate means open and close simultaneously, and the fifth gate means opens and closes as the first gate means closes and opens respectively. The logic array circuit further comprises a subcircuit for deriving a third gate means pulse train from the single clock pulse train for controlling the opening and closing of the third gate means. During a first time period the first, second and fourth gate means are opened and then closed, and the fifth gate means is closed and then opened. The first set of input signals is thereby transmitted to a respective one of the input columns, any charge on the rows is discharged, and the at least one output column is pre-charged. The third gate means remains closed during the first time period. During a second time period the third gate means is opened and then closed, the first, second and fourth gate means remain closed, and the fifth gate means remains open. The state of each row is thereby determined by the state of the respective second input signal and the state of the input columns. The state of the at least one output column is then determined by the resultant state of the rows, and the resultant state of the at least one output column is then transferred to the output of the logic array circuit. The aggregate length of the first and second time periods is equal to the period of the single clock pulse train.

One circuit of the first form of the invention is a programmable logic array circuit in which the second set of input signals are all in a high state and are adapted to charge those rows which do not share first transistors with charged first columns. Another circuit of the first form of the invention is a multiplexer circuit in which the first set of input signals is utilized for selecting one of the rows and in which the at least one output column is a single output column. In this circuit, the state of that one of the second set of input signals associated with the selected row is passed to the output of the logic array circuit.

The first time period may have a length slightly greater than one-half of the period of the single clock pulse train. The first, second, fourth and fifth gate means may each be open for a time equal to one-half of the period of the single clock pulse train. The third gate means may be open for a time approximating one-eighth of the period of the single clock pulse train.

A second form of the invention is a memory circuit. The input plane of the memory circuit corresponds to the input plane of the multiplexer circuit already described, except that the third gate means connects each of the rows to a charge source rather than to the input signals of the multiplexer. Each of the rows represents a discrete memory address selected by a unique set of values on the input columns. The first, second and fourth gate means function in a similar manner to those in the programmable logic array and multiplexer circuits previously described. The output columns of this circuit are paired, each output column pair being connected to a series of storage elements. Each of those storage elements is associated with a respective row of the memory circuit through a pair of gates associated with that row. Each pair of output columns forms the inputs to a comparator having its output connected to the input of a fifth gate means, the output of which is the output of the memory circuit. The memory circuit also has a sixth gate means and a seventh gate means for controlling the input of data to the pairs of output columns. The sixth gate means is connected between the data to be input and an intermediate input, and the seventh gate means is connected between the intermediate input and the output columns. The first, second, fourth and sixth gate means open and close simultaneously. The fifth gate means is open during the time that a read/write signal is in the read mode and the first gate means is closed. The seventh gate means is open during the time that the read/write signal is in the write mode and the first gate means is closed. As with the first form of the invention, the memory circuit has a subcircuit for deriving a third gate means pulse train from the single clock pulse train for controlling the opening and closing of the third gate means. During a first time period the first, second, fourth and sixth gate means are opened then closed, either the fifth or seventh gate means is closed then opened, and the third gate means remains closed. One gate means of the fifth and seventh gate means is closed then opened, and the other gate means of the fifth and seventh gate means remains closed. The selection signals are thereby each transmitted to a respective one of the input columns for selecting one of the rows, any charge on the rows is discharged, the pairs of output columns are charged, and the state of the data input is transferred to the intermediate input of the memory circuit. During a second time period the third gate means is opened then closed, the first, second, fourth and sixth gate means remain closed. One gate means of the fifth and seventh gate means remains open, and the other gate means of the fifth and seventh gate means remains closed. The selected row thereby assumes a charged state, and each pair of output columns is connected to a respective storage element associated with the selected row. The state of the pairs of output columns is transferred to the output of the memory circuit when the read/write signal is in the read mode, and the state of the intermediate input is transferred to the pairs of output columns when the read/write signal is in the write mode. The aggregate length of the first and second time periods is equal to the period of the single clock pulse train.

The invention will next be described in terms of a preferred embodiment utilizing the accompanying drawings, in which.

Figure 1:
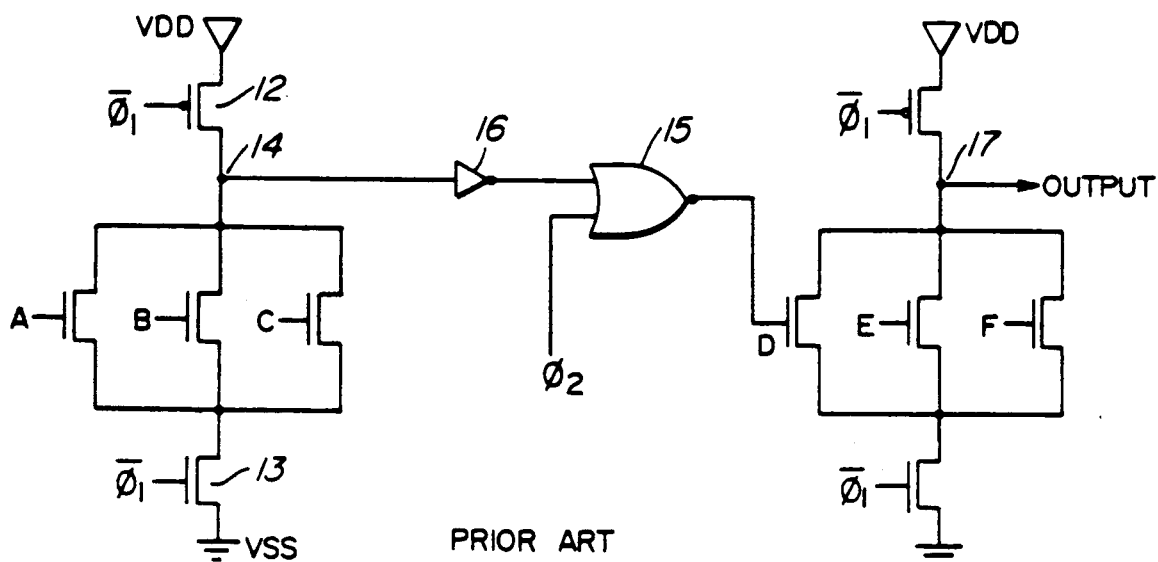
FIG. 1 is a schematic diagram of a prior art circuit having a pair of dynamic CMOS gates and intermediate logic connecting those gates, the prior art circuit requiring two clock input signals.

The diagram of FIG. 1 is based on a description of a prior art two-phase dynamic CMOS circuit at pages 358 and 359 of Principles of CMOS VLSI Design—A Systems Perspective by Neil Weste and Kamran Eshraghian (Addison-Wesley Publishing Company, 1985).

The prior art basic dynamic CMOS circuit of FIG. 1 has a pre-charge phase occurring when first clock input $\phi_1$ is high. Pre-charge p-transistor 12 opens and n-transistor 13 simultaneously closes. Charge passing through p-transistor 12 then pre-charges node 14. The second clock input $\phi_2$ is maintained high during the pre-charge phase, forcing the output D of NOR gate 15 to maintain a low state irrespective of the state of node 14. The inputs A, B and C are allowed to change during the pre-charge phase, but must remain constant at other times. As clock input $\phi_1$ falls, transistors 12 and 13 close and open, respectively. If any one of the inputs A, B and C is in a high state, the charge on node 14 will discharge to ground; otherwise, node 14 will maintain a high state. The two-phase clocking scheme is set up such that clock input $\phi_2$ will not go low before the state of node 14 has stabilized. The value on node 14 is transferred through inverter 16 to the input of NOR gate 15, and after clock input $\phi_2$ has gone low the value at output D of NOR gate 15 assumes the value on node 14. Node 17 is carrying a charge (having been pre-charged at the same time as node 14), and the value on output D of NOR gate 15, along with the value on inputs E and F, determines the OUTPUT value at node 17 during the evaluate phase (when clock inputs $\phi_1$ and $\phi_2$ are both low).

Figure 2:
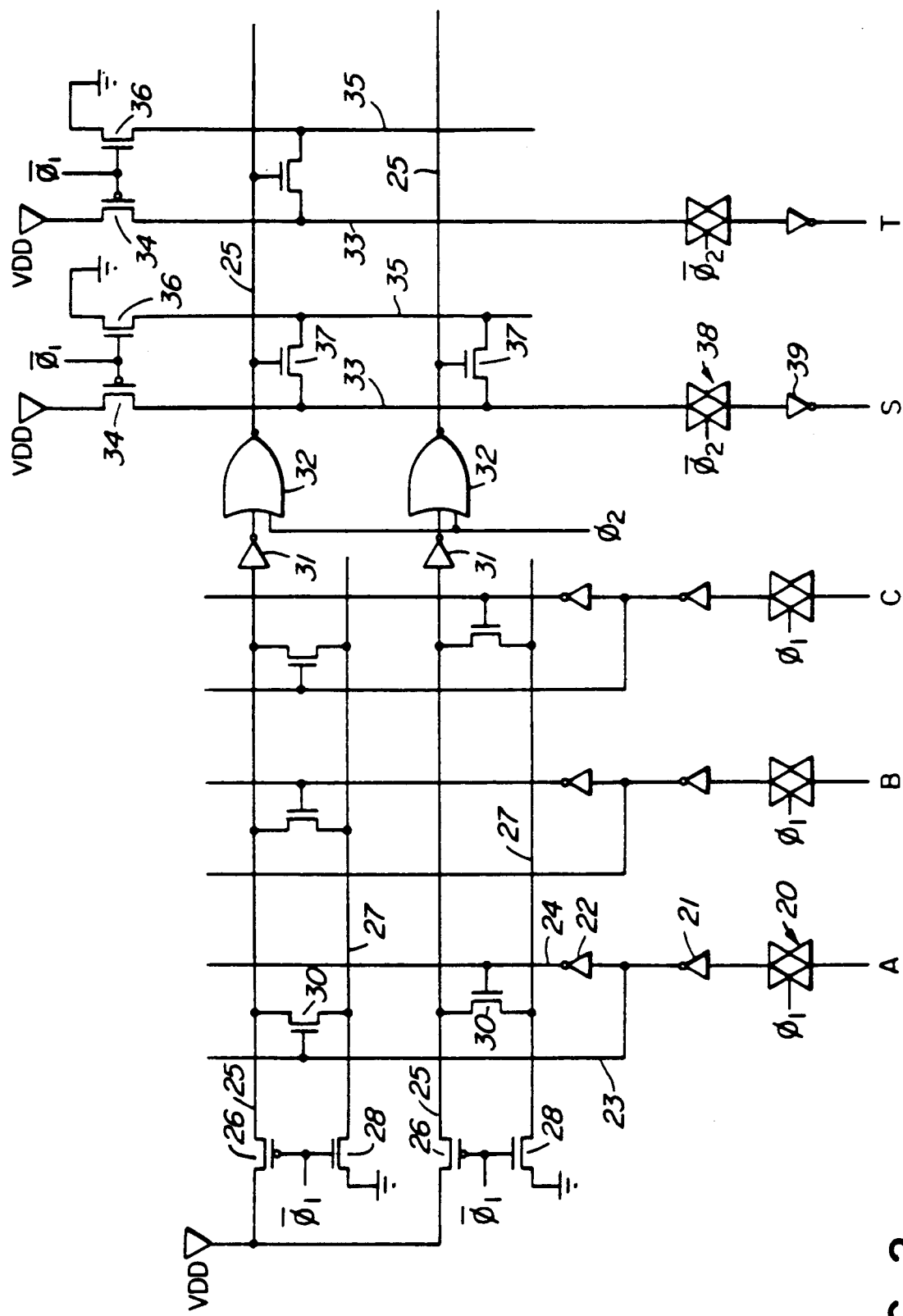
FIG. 2 is a schematic diagram of a prior art programmable logic array circuit constructed from the dynamic CMOS gates and intermediate logic illustrated in FIG. 1.

FIG. 2 illustrates a programmable logic array constructed using the two-phase dynamic CMOS logic of FIG. 1. The logic array has an AND plane and an OR plane. The AND plane has a series of input gates 20, each controlled by the first clock input $\phi_1$ of the two-phase clock. A pair of inverters 21 and 22 are connected serially to the output of each gate 20. The outputs of inverters 21 and 22 are connected to an inverted input column line 23 and a non-inverted input column line 24, respectively. The circuit of FIG. 2 has a pair of row lines 25 each of which is connected to a power voltage VDD through a pre-charge p-transistor 26. A pair of ground lines 27 are connected to VSS through a series of n-transistors 28. The gate of each pair of transistors 26 and 28 are connected through an inverter (not shown) to first clock input $\phi_1$. A series of first logic transistors 30 are each selectively positioned such that its channel extends between a row line 25 and a ground line 27, and its gate is connected to either an inverted column line 23 or a non-inverted column line 24. Each row line 25 is connected to the input of an inverter 31, the output of which is one of the inputs to a two-input NOR gate 32. The other input to each NOR gate 32 is second clock input $\phi_2$. The OR plane has a pair of output column lines 33 each connected to VDD through a p-transistor 34, and has a pair of ground lines 35 each connected to VSS through a n-transistor 36. The gate of each pair of transistors 34 and 36 are connected through an inverter (not shown) to first clock input $\phi_1$. A series of second logic transistors 37 are each selectively positioned such that its channel extends between an output column line 33 and a ground line 35, and its gate is connected to a row line 25. Each output column line 33 is connected to the input of an output gate 38 controlled by second clock input $\phi_2$. The output of each gate 38 then passes through an inverter 39. When each of the input gates 20 is open, ie. when clock input $\phi_1$ is high, the state of the three inputs A, B and C appears in inverted form on each of the input column lines 23 and in non-inverted form on each of the input column lines 24. Each of the input column lines 23 and 24 may be connected to the gate of one or more of the first logic transistors 30. When one of the input column lines 23 and 24 is in a high state, the first logic transistors 30 connected to that column line are turned on to connect a respective row line 25 with the associated ground line 27. During this phase the pre-charge transistors 26 are turned on and the transistors 28 are turned off, so that any row lines 25 and ground lines 27 connected to on logic transistors 30 are charged to VDD. The state of the row lines 25 does not affect the OR plane because clock input $\phi_2$ is high. Clock input $\phi_1$ then goes low, the pre-charging of the AND plane and OR plane is terminated, and any row lines 25 connected to on logic transistors 30 are discharged. By the time that clock input $\phi_2$ goes low, the input signals have propagated through the AND plane logic. The state of each row line 25 is then passed to the OR plane. Each row line 25 may be connected to the gate of one or more of the second logic transistors 37 in the OR plane, and determines which of the output column lines 33 are discharged to ground through the transistors 36. As an example output of the programmable logic array of FIG. 2, the S output would be equal to $(A.\bar{B}.C)+(\bar{A}.\bar{C})$.

Figure 3:
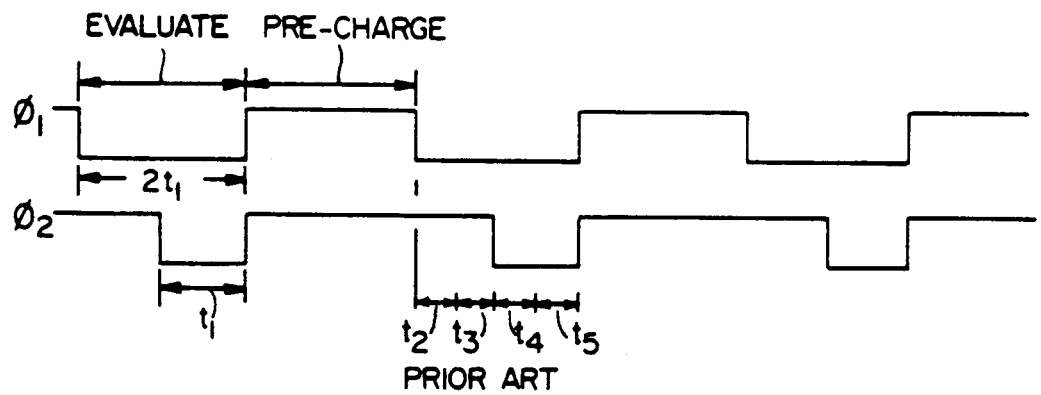
FIG. 3 is a typical timing diagram of the two clock input signals utilized with the circuits of FIGS. 1 and 2.
Figure 4:
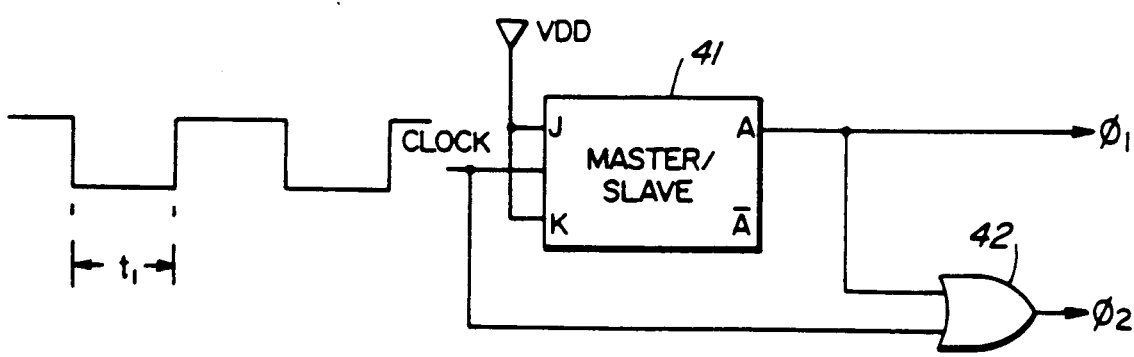
FIG. 4 is a schematic diagram of a typical circuit used to obtain the two clock input signals required by the circuit of FIGS. 1 and 2.

FIG. 3 illustrates two typical clock inputs $\phi_1$ and $\phi_2$ used by the circuits of FIGS. 1 and 2, and FIG. 4 illustrates a typical circuit for creating the two clock inputs from an external CLOCK input having a period of $2t_1$. The external CLOCK input is fed into a J-K master/slave flip-flop 41 to create clock input $\phi_1$, which has one-half the frequency of the external CLOCK input. The external CLOCK input and clock input $\phi_1$ are fed into an OR gate 42 to form clock input $\phi_2$. With the circuit of FIG. 4, clock input $\phi_2$ goes low half-way through the evaluate phase of clock input $\phi_1$. One half of the evaluate phase (equal to the aggregate time $t_2+t_3$ in FIG. 3) is used for stabilizing the AND plane logic before the AND plane output is passed to the OR plane logic. Time $t_2$ is the time taken for the signal level at node 14 to change in the AND plane, and time $t_3$ is a time margin added to ensure stability prior to clock input $\phi_2$ going low. Time $t_2$ is typically made equal to time $t_3$. The other half of the evaluate phase (equal to the aggregate time $t_4+t_5$ in FIG. 3) is available for passing signals through the OR plane. Time $t_4$ is the time taken for the signal level at node 17 to change after clock input $\phi_2$ has gone low, and time $t_5$ is wasted time. This prior art circuit requires two external CLOCK inputs to pass a signal from its input to its output. As will subsequently become evident, the time margin $t_3$ is not needed with the circuit of the invention, which requires only a single external CLOCK input to pass a signal from its input to its output.

Figure 5:
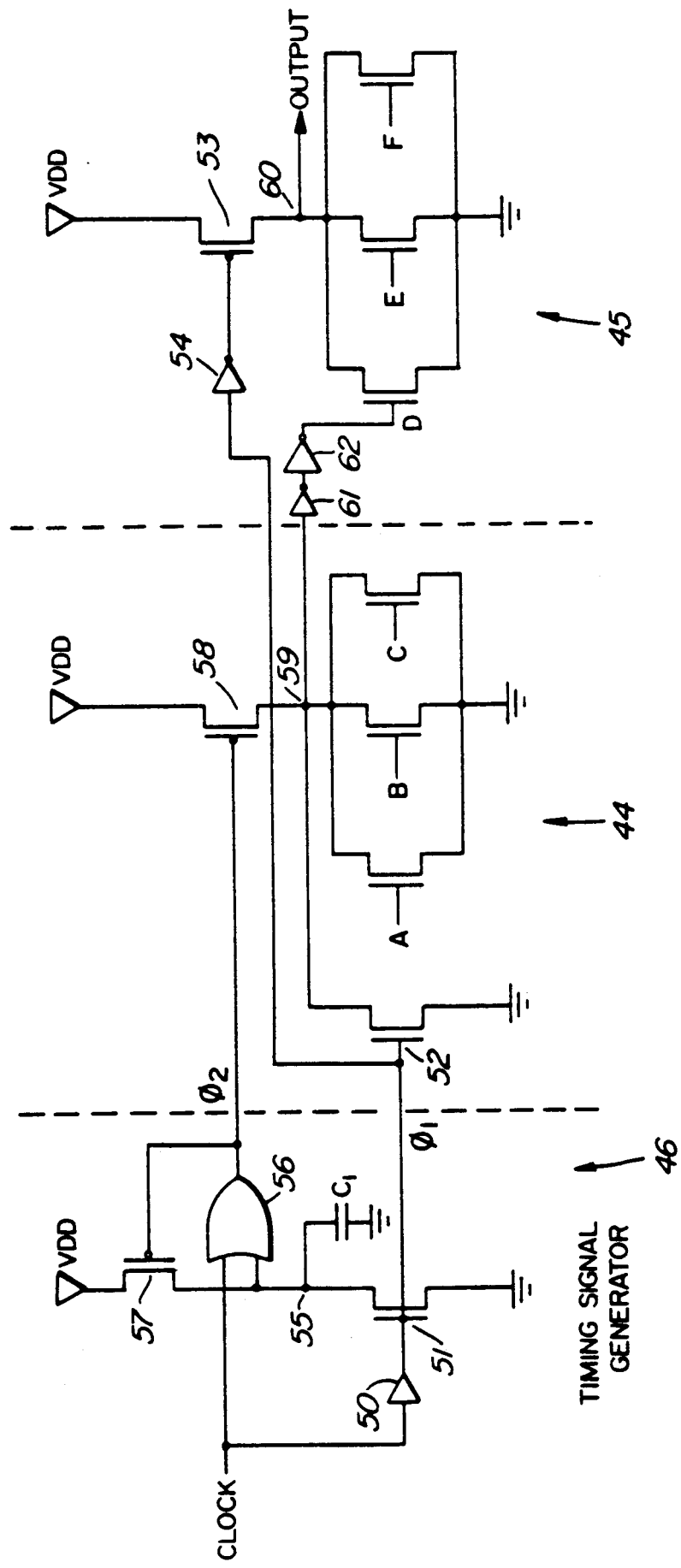
FIG. 5 is a schematic diagram of a circuit having a pair of dynamic CMOS gates of the invention and a timing signal generator for creating the two clock input signals required by the CMOS gates of the invention.
Figure 6:
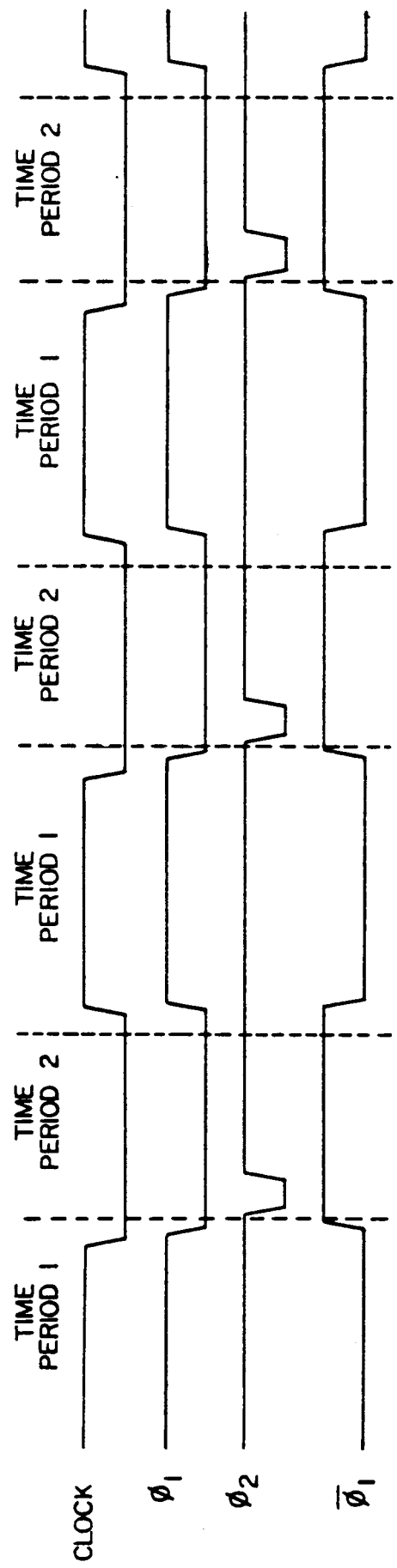
FIG. 6 is a timing diagram of the clock input signals created by the circuit of FIG. 5.

FIG. 5 illustrates a basic embodiment of the dynamic CMOS logic circuit of the invention, comprising a pair of basic logic gate circuits 44 and 45 driven by a timing signal generator circuit 46. FIG. 6 illustrates the two clock inputs $\phi_1$ and $\phi_2$ created from the external CLOCK input by timing signal generator circuit 46.

The basic embodiment of FIG. 5 operates in the following way. Passing the external CLOCK input through driver 50 creates the clock input $\phi_1$, and that clock input drives n-transistors 51 and 52, and also drives p-transistor 53 through inverter 54. When the external CLOCK input is high, transistors 51, 52 and 53 are all turned on. Capacitor $C_1$ discharges through transistor 51, and node 55 drops to a low state. The output of OR gate 56, which is clock input $\phi_2$, is high and transistors 57 and 58 are turned off. Any charge on node 59 is discharged to VSS, while node 60 is simultaneously pre-charged to VDD through transistor 53. When the external CLOCK input goes low, transistors 51, 52 and 53 turn off. OR gate 56 has two low inputs, and clock input $\phi_2$ goes low. Pre-charge transistors 57 and 58 turn on, and capacitor $C_1$ starts to charge. Capacitor $C_1$ is sized so as to ensure that clock input $\phi_2$ remains low a sufficient time for charge passing through transistor 58 to evaluate logic gate circuit 44; that time is typically in the order of one-eighth of the period of the external CLOCK input. After capacitor $C_1$ has charged, one input of OR gate 56 is high; clock input $\phi_2$ then goes high and the transistors 57 and 58 turn off. The logic inputs A, B and C are evaluated while transistor 58 is on. If one of those inputs is high, node 59 assumes the ground state; otherwise, node 59 assumes a high state. Node 59 is connected to input D of the OR plane as shown in FIG. 5, and would normally also be connected to the inputs of other logic gate circuits 45. In order to minimize the load capacitance on node 59, the output of logic gate circuit 44 is normally buffered by a pair of drive inverters 61 and 62. Input D propagates with inputs E and F through circuit 45 to create an OUTPUT value. When the external CLOCK input returns high, transistors 51, 52 and 53 turn on, clock input $\phi_2$ is not affected, and the process earlier described is repeated. The circuit of the invention does not require the time margin of the prior art circuit, and the time required for signals to pass from the input of circuit 44 to the output of circuit 45 is equal to the period of one external CLOCK cycle, ie. half of the time required for signal propagation through the prior art circuit.

The designations TIME PERIOD 1 and TIME PERIOD 2 have been placed in FIG. 6 to assist in describing the relationship between clock inputs $\phi_1$ and $\phi_2$. Although the aggregate of TIME PERIOD 1 and TIME PERIOD 2 is equal to the period of the external CLOCK input, TIME PERIOD 2 is slightly shorter than TIME PERIOD 1.

Figure 7:
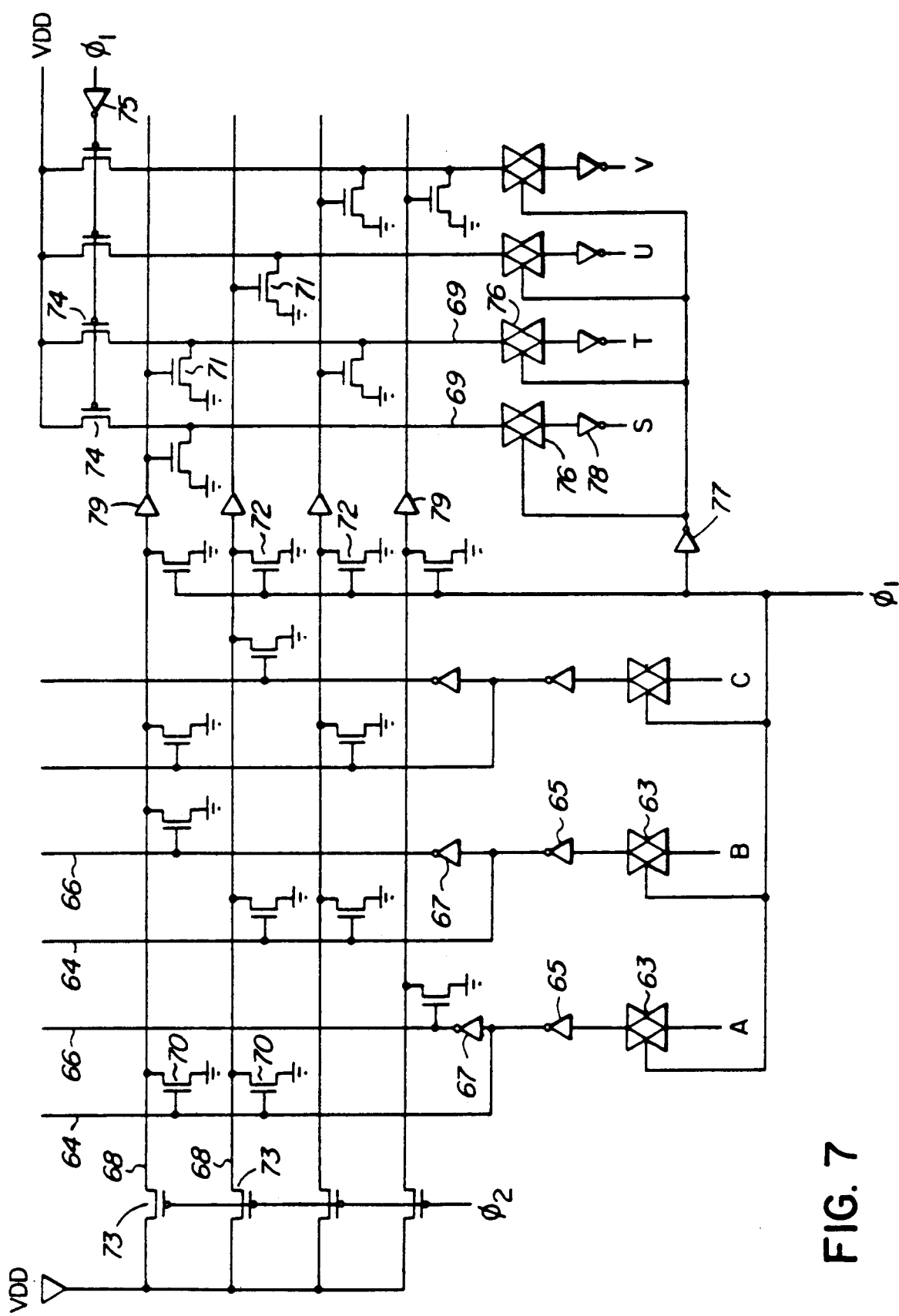
FIG. 7 is a schematic diagram of a programmable logic array circuit utilizing the dynamic CMOS gates of the invention.
Figure 8:
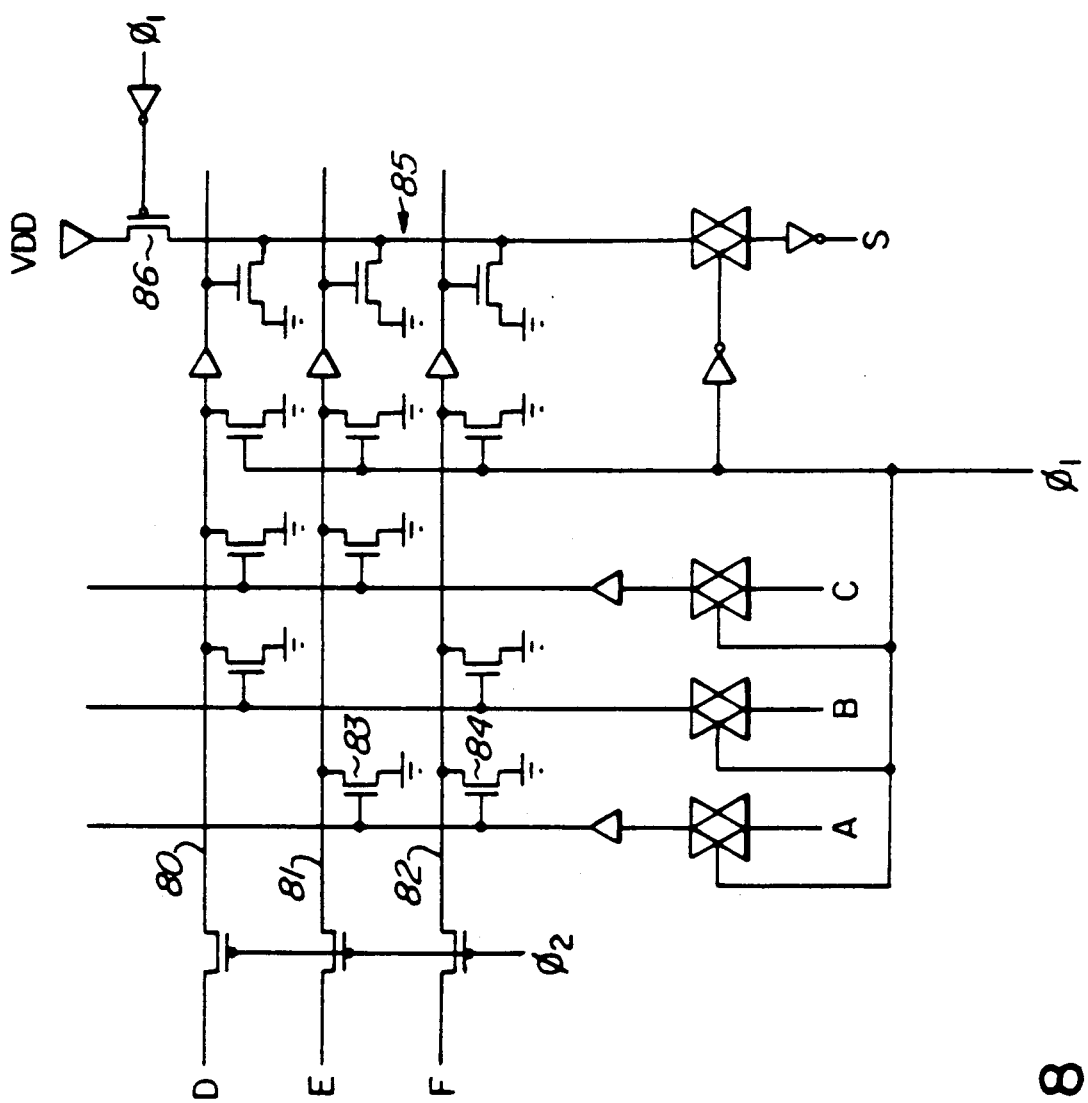
FIG. 8 is a schematic diagram of a multiplexer circuit utilizing the dynamic CMOS gates of the invention.
Figure 9:
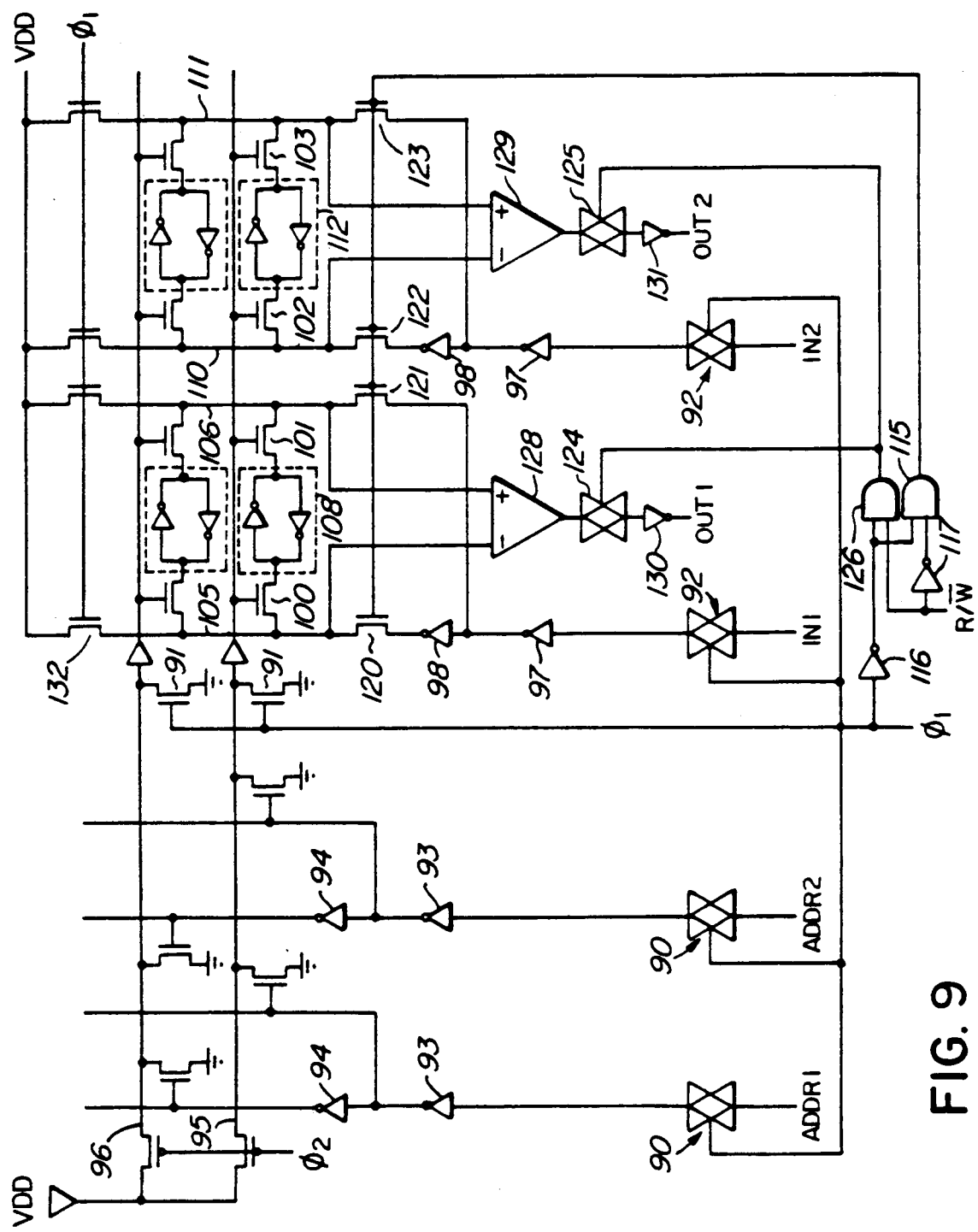
FIG. 9 is a schematic diagram of a memory array circuit utilizing the dynamic CMOS gates of the invention.

FIGS. 7, 8 and 9 illustrate three circuits embodying the clocking scheme of the invention. All three circuits utilize a signal generator circuit corresponding to circuit 46. FIG. 7 is a diagram of a programmable logic array circuit having logic comparable to that in the prior art circuits of FIGS. 2. FIG. 8 is a diagram of a multiplexer circuit, and FIG. 9 is a diagram of a memory circuit.

With respect to the programmable logic array circuit of FIG. 7, each of the inputs A, B and C is fed into an input transmission gate 63 controlled by clock input $\phi_1$. The output of gate 63 is connected to an inverted input column line 64 through a first inverter 65. The output of first inverter 65 is connected to a non-inverted input column line 66 through a second inverter 67. The circuit of FIG. 7 has a series of input column lines 64 and 66, row lines 68, output column lines 69, first logic transistors 70 and second logic transistors 71 similar to those earlier described with respect to FIG. 2. The circuit of FIG. 7 also has a series of transistors 72 each having its channel extending between one of the row lines 68 and VSS and having its gate connected to clock input $\phi_1$. Charge passes from VDD to the row lines 68 through a series of transistors 73 each having its gate connected to clock input $\phi_2$. Charge passes from VDD to the output column lines 69 through a series of transistors 74 each having its gate connected to clock input $\phi_1$ through an inverter 75. Each of the output column lines is connected to an output transmission gate 76 controlled by clock input $\phi_1$ through an inverter 77. The outputs of the gates 76, when inverted by a series of inverters 78, represent the output of the programmable logic array circuit.

The programmable logic circuit of FIG. 7 operates in the following way. When clock input $\phi_1$ goes high, the state of the inputs A, B and C are placed on the respective input column lines 64 and 66, any charge on the row lines 68 is discharged through the transistors 72, and the state of the outputs on the inverters 78 becomes the outputs S, T, U and V. Clock input $\phi_1$ then goes low, preventing any change on the inputs A, B and C from affecting the input column lines 64 and 66, and turning off the transistors 72. The transistors 74 turn off, terminating the pre-charging of the output column lines 69. Clock input $\phi_2$ then goes low for a short time, allowing each of the transistors 73 to pass charge from VDD. The charge is retained on those row lines 68 which are connected to first logic transistors 70 that are all in the off state The state of the row lines 68 determines which of the output column lines 69 retain their charge, a high state on a row line 68 resulting in the second logic transistors connected to that row line discharging the charge from any connected output column lines 69. Since each of the gates 76 is open, the state of the output column lines 69 appears inverted at the output of the inverters 78. When clock input $\phi_1$ goes high, the process repeats. As with the basic circuit of FIG. 5, a buffer means must be placed between the output of the AND plane and the input of the OR plane. Each driver 79 in FIG. 7 is formed from a pair of drive inverters having a construction and function corresponding with the inverters 61 and 62 earlier described with respect to FIG. 5.

The multiplexer circuit of FIG. 8 operates in a similar fashion. With this circuit, the inputs A, B and C each act to select one of the row lines 80, 81 or 82, respectively. For instance, an (A,B,C) value of (1,0,0) selects row line 80. When clock input $\phi_2$ goes high, the state of the D input is maintained on row line 80. The state of the E and F inputs are not retained on row lines 81 and 82, because an (A,B,C) value of (1,0,0) results in any charge that enters row lines 81 and 82 being dissipated through transistors 83 and 84. The state of row line 80 determines the state of the output column line 85 after pre-charging through transistor 86. If row line 80 is high, output column line 85 goes low; if row line 80 is low, output column line 85 stays high. The state of the S output is the inverse of the state of output column 85. If (A,B,C) has the value (0,1,0), the S output will assume the value on the E input after one cycle of the external CLOCK input.

With respect to the memory circuit of FIG. 9, the pairs of gates 90, 91 and 92 are open when clock input $\phi_1$ is high. The pair of gates 90 pass the address selection values (ADDR1,ADDR2) to the pairs of inverters 93 and 94. An (ADDR1,ADDR2) value of (1,1) selects row line 95, and an (ADDR1,ADDR2) value of (0,0) selects row line 96. With clock input $\phi_1$ high, the pair of gates 91 are open for grounding row lines 95 and 96, and the pair of gates 92 pass input data values IN1 and IN2 to the pairs of inverters 97 and 98.

After clock input $\phi_1$ goes low, clock input $\phi_2$ goes low and then high. If row line 95 is selected, it remains in a high state after clock input $\phi_2$ returns high. A high state on row line 95 results in the opening of transistors 100, 101, 102 and 103. During a write operation, the complementary state of the output column lines 105 and 106 will determine the state of the storage unit 108, and the complementary state of the output column lines 110 and 111 will determine the state of storage unit 112. If the READ/$\overline{\text{WRITE}}$(R/$\overline{\text{W}}$) input is low (for a write cycle), the output of AND gate 115 goes high when clock input $\phi_1$ goes low (that clock input and R/$\overline{\text{W}}$ input being inverted by the inverters 116 and 117, respectively). Transistors 120, 121, 122, and 123 are then in an open condition. Transmission gates 124 and 125 will remain closed during the time that the R/$\overline{\text{W}}$ input is low since the output of AND gate 126 remains in a low state during that time. With transistors 100, 101, 102, 103, 120, 121, 122 and 123 all on, the values on the pairs of inverters 97 and 98 are passed to the storage units 108 and 112. The former value on each of the storage units 108 and 112 is either maintained or is flipped. As clock input $\phi_1$ returns high, the transistors 100, 101, 102, 103, 120, 121, 122 and 123 are turned off, and the values on storage units 108 and 112 can no longer be affected. If the R/$\overline{\text{W}}$ input is high (for a read cycle), the output of AND gates 115 and 126 go low and high, respectively, as clock input $\phi_1$ goes low. Transistors 120, 121, 122 and 123 thereby remain closed throughout the read cycle. Transistors 100, 101, 102 and 103 and transmission gates 124 and 125 are open during that portion of the read cycle in which clock cycle $\phi_1$ is low. The values on storage units 108 and 112 are passed to the respective pairs of inputs of comparators 128 and 129, respectively, and appear at the output of inverters 130 and 131, respectively. Those outputs, designated as OUT1 and OUT2 in FIG. 9, are unaffected by the return of clock input $\phi_1$ to the high state. Each of the transistors 132 is a NMOS transistor driven by the clock input $\phi_1$ directly; in contrast, each of the corresponding precharge transistors in the circuits of FIGS. 7 and 8 is a PMOS transistor driven by the inverted clock input $\phi_1$. The difference results from the fact that the noise margins required on the output column lines of the circuits of FIGS. 7 and 8 are not required for the circuit of FIG. 9 because of the presence of comparators 128 and 129. For proper performance of the memory circuit, the R/$\overline{\text{W}}$ input should not change its state during the time that the external CLOCK input is in the low state.

The programmable logic array, multiplexer and memory circuits that have been described are all capable of operating with the single-phase clock input. Very high clock speeds (in the order of 100 MHz with existing technology) may be used with these circuits.

I claim:

1. A two-plane logic array circuit adapted to be operated from a single clock pulse train and having an input plane and an output plane, the input plane being defined by an array of rows and input columns, the output plane being defined by an array of the rows and at least one output column, a series of first transistors being selectively positioned in the input plane at the intersection of the rows with the input columns such that a charge on one of the input columns results in the discharge of any charge on those rows sharing first transistors with that column, a series of second transistors being selectively positioned in the output plane at the intersection of the rows with the at least one output column such that a charge on one of the rows results in the discharge of any charge on any output column that shares second transistors with that row, the circuit further comprising first, second, third, fourth and fifth gate means, the first gate means controlling the transmission of each of a first set of input signals to a respective one of the input columns, the second gate means controlling the discharge of charge from the rows, the third gate means and the state of the input columns controlling the charging of each of the rows with a respective one of a second set of input signals, the fourth gate means controlling a pre-charging of the at least one output column, and the fifth gate means controlling the transmission of the state of the at least one output column to the output of the logic array circuit, the first, second and fourth gate means opening and closing simultaneously, the fifth gate means closing as the first gate means opens and opening as the first gate means closes, the logic array circuit further comprising a subcircuit for deriving a third gate means pulse train from the single clock pulse train for controlling the opening and closing of the third gate means;

whereby during a first time period the first, second and fourth gate means are opened and then closed, and the fifth gate means is closed then opened, each of the first set of input signals being thereby transmitted to a respective one of the input columns, any charge on the first rows being discharged, and the at least one output column being pre-charged, the third gate means remaining closed during the first time period, and whereby during a second time period the third gate means is opened and then closed, the first, second and fourth gate means remaining closed and the fifth gate means remaining open during the second time period, the state of each row being thereby determined by the state of the respective second input signal and the state of the input columns, the state of the at least one output column then being determined by the resultant state of the rows, and the resultant state of the at least one output column then being transferred to the output of the logic array circuit, and whereby the aggregate length of the first and second time periods is equal to the period of the single clock pulse train.

2. A circuit as in claim 1, wherein the second set of input signals are all in a high state and are adapted to charge those rows which are not sharing first transistors with charged input columns.

3. A circuit as in claim 1, wherein the first set of input signals are utilized for selecting one of the rows and wherein the at least one output column is a single output column, the circuit acting as a multiplexer for passing the state of that one of the second set of input signals associated with the selected row to the output of the logic array circuit.

4. A circuit as in claim 1, wherein the first time period has a length slightly greater than one-half of the period of the single clock pulse train.

5. A circuit as in claim 1, wherein the first, second, fourth, and fifth gate means are each open for a time equal to one-half of the period of the single clock pulse train.

6. A circuit as in claim 1, wherein the third gate means is open for a time approximating one-eighth of the period of the single clock pulse train.

7. A programmable logic array circuit adapted to be operated from a single clock pulse train and having a series of rows, a series of input columns and a series of output columns, a series of first transistors being selectively positioned at the intersection of the rows with the input columns such that a charge on one of the input columns results in the discharge of any charge on those rows sharing first transistors with that input column, a series of second transistors being selectively positioned at the intersection of the rows with the output columns such that a charge on one of the rows results in the discharge of any charge on those second columns sharing second transistors with that row, the logic circuit having a first gate means for controlling the transmission of each of a first set of input signals to a respective one of the input columns, the logic circuit having a second gate means for controlling the discharge of charge from the rows, the logic circuit having a third gate means for controlling the flow of charge from a charge source into each of the rows, the logic circuit having a fourth gate means for controlling pre-charging of the output columns and having a fifth gate means for transferring the state of the output columns to the output of the logic array circuit, the first, second and fourth gate means opening and closing simultaneously, the fifth gate means opening when the first gate means closes and closing when the first gate means opens, the logic array circuit also having a subcircuit for deriving a third gate means pulse train from the single clock pulse train for controlling the opening and closing of the third gate means;

whereby during a first time period the first, second, and fourth gate means are opened then closed, the fifth gate means is closed then opened, and the third gate means remains closed, the set of input signals each being thereby transmitted to a respective one of the input columns, any charge on the rows being discharged, and the output columns being charged, and whereby during a second time period the third gate means is opened then closed, the first, second, and fourth gate means remain closed, and the fifth gate means remains open, the rows being thereby charged according to the state of the input columns, the output columns being charged according to the resultant state of the rows, and the resultant state of the output columns being transferred to the output of the logic array circuit, and whereby the aggregate length of the first and second time periods is equal to the period of the single clock pulse train.

8. A multiplexer circuit adapted to be operated from a single clock pulse train and having a series of rows, a series of input columns and an output column, a series of first transistors being selectively positioned at the intersection of the rows with the input columns such that a charge on one of the input columns results in the discharge of any charge on those rows sharing first transistors with that input column, the first transistors being positioned such that each of the rows is selected by a unique set of values on the input columns, a series of second transistors each being positioned at the intersection of a respective one of the rows with the output column such that a charge on any one of the rows results in the discharge of any charge on the output column, the circuit having a first gate means for controlling the transmission of a set of selection signals to the input columns, the circuit also having a second gate means for controlling the discharge of charge from the rows and having a third gate means for controlling the transmission of a set of input signals to the rows, the circuit further having a fourth gate means for controlling the charging of the output column and having a fifth gate means for transferring the state of the output column to the output of the multiplexer circuit, the first, second, and fourth gate means opening and closing simultaneously, the fifth gate means opening when the first gate means closes and closing when the first gate means opens, the multiplexer circuit also having a sub-circuit for deriving a third gate means pulse train from the single clock pulse train for controlling the opening and closing of the third gate means;

whereby during a first time period the first, second and fourth gate means are opened then closed, the fifth gate means is closed then opened, and the third gate means remains closed, the selection signals thereby being transmitted to the input columns for selecting one of the rows, any charge on the rows being discharged and the output column being charged, and whereby during a second time period the third gate means is opened then closed, the first, second, and fourth gate means remain closed, and the fifth gate means remains open, the selected row thereby assuming the state of the input signal associated with that selected row, the output column being charged according to the state on the selected row, and the state of the output column being transferred to the output of the logic array circuit, and whereby the aggregate length of the first and second time periods is equal to the period of the single clock pulse train.

* * * * *